United States Patent
Choi et al.

(10) Patent No.: US 12,476,180 B2
(45) Date of Patent: Nov. 18, 2025

(54) INTERCONNECTION STRUCTURE AND SEMICONDUCTOR PACKAGE INCLUDING THE SAME

(71) Applicant: SAMSUNG ELECTRONICS CO., LTD., Suwon-si (KR)

(72) Inventors: Ju-Il Choi, Seongnam-si (KR); Jumyong Park, Cheonan-si (KR); Jin Ho An, Seoul (KR); Chungsun Lee, Ansan-si (KR); Teahwa Jeong, Hwaseong-si (KR); Jeonggi Jin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 300 days.

(21) Appl. No.: 18/189,834

(22) Filed: Mar. 24, 2023

(65) Prior Publication Data
US 2023/0238316 A1    Jul. 27, 2023

Related U.S. Application Data

(63) Continuation of application No. 17/099,929, filed on Nov. 17, 2020, now Pat. No. 11,637,058.

(30) Foreign Application Priority Data

Apr. 29, 2020    (KR) ........................ 10-2020-0052231

(51) Int. Cl.
*H01L 23/48*    (2006.01)
*H01L 23/31*    (2006.01)
(Continued)

(52) U.S. Cl.
CPC .... *H01L 23/49838* (2013.01); *H01L 23/3128* (2013.01); *H01L 23/49811* (2013.01);
(Continued)

(58) Field of Classification Search
None
See application file for complete search history.

(56) References Cited

U.S. PATENT DOCUMENTS 5,082,718 A * 1/1992 Chantraine .......... H05K 3/4647
                                                    428/209
6,174,796 B1 * 1/2001 Takagi .............. H01L 21/76838
                                                    257/E21.582
(Continued)

FOREIGN PATENT DOCUMENTS

JP    2011-9770 A    1/2011
JP    2016-42544 A   3/2016
(Continued)

*Primary Examiner* — Nicholas J Tobergte
(74) *Attorney, Agent, or Firm* — Sughrue Mion, PLLC

(57) ABSTRACT

A method for manufacturing a semiconductor package may include: forming a photoimageable dielectric layer on a substrate including a pad; forming a preliminary via hole in the photoimageable dielectric layer to expose the pad; forming a hard mask layer on the photoimageable dielectric layer and the pad; etching the photoimageable dielectric layer and the hard mask layer to form a via hole, a first hole, and a trench; forming a metal layer on the photoimageable dielectric layer connected to the pad; planarizing the metal layer to form a wiring pattern; and placing a semiconductor chip electrically connected to the wiring pattern. The first hole may be disposed on the via hole and connected thereto, and a diameter of the first hole may be larger than a diameter of the via hole.

20 Claims, 13 Drawing Sheets

(51) Int. Cl.
   *H01L 23/498*   (2006.01)
   *H01L 25/065*   (2023.01)
   *H01L 25/10*    (2006.01)

(52) U.S. Cl.
   CPC .... *H01L 23/49822* (2013.01); *H01L 25/0652* (2013.01); *H01L 25/105* (2013.01)

(56) References Cited

U.S. PATENT DOCUMENTS

| | | | |
|---|---|---|---|
| 6,239,025 B1 * | 5/2001 | Bease | H01L 21/76807 257/E23.145 |
| 6,559,548 B1 * | 5/2003 | Matsunaga | H01L 23/53295 257/E23.021 |
| 6,577,011 B1 * | 6/2003 | Buchwalter | H01L 21/7682 257/E23.161 |
| 7,326,651 B2 | 2/2008 | Baks et al. | |
| 8,809,183 B2 | 8/2014 | Bonilla et al. | |
| 9,331,021 B2 | 5/2016 | Yu et al. | |
| 9,716,074 B2 | 7/2017 | Chen et al. | |
| 9,768,065 B1 | 9/2017 | Wang et al. | |
| 9,831,195 B1 * | 11/2017 | Lu | H01L 23/13 |
| 10,510,695 B2 | 12/2019 | Yu et al. | |
| 10,515,921 B2 * | 12/2019 | Yu | H01L 23/5383 |
| 10,535,633 B2 * | 1/2020 | Wei | H01L 25/18 |
| 2002/0146900 A1 * | 10/2002 | Surprenant | H01L 23/5283 257/E21.59 |
| 2005/0088833 A1 * | 4/2005 | Kikuchi | H01L 23/3121 257/E23.125 |
| 2006/0043572 A1 * | 3/2006 | Sugimoto | H05K 1/0251 257/774 |
| 2006/0079079 A1 * | 4/2006 | Muthukumar | H01L 23/49827 257/E21.597 |
| 2011/0304054 A1 * | 12/2011 | Sakai | H10D 64/513 438/700 |
| 2014/0183751 A1 * | 7/2014 | Yoshioka | G11B 5/486 257/773 |
| 2014/0284593 A1 | 9/2014 | Nakano et al. | |
| 2017/0069532 A1 | 3/2017 | Lee et al. | |
| 2019/0214346 A1 * | 7/2019 | Ashida | H01L 23/5329 |
| 2020/0027833 A1 * | 1/2020 | Lee | H01L 24/20 |
| 2020/0051928 A1 * | 2/2020 | Park | H01L 23/5389 |
| 2021/0343634 A1 * | 11/2021 | Choi | H01L 23/49838 |

FOREIGN PATENT DOCUMENTS

| | | |
|---|---|---|
| KR | 10-2012-0054840 A | 5/2012 |
| KR | 10-2017-0030306 A | 3/2017 |
| KR | 10-2020-0018111 A | 2/2020 |

* cited by examiner

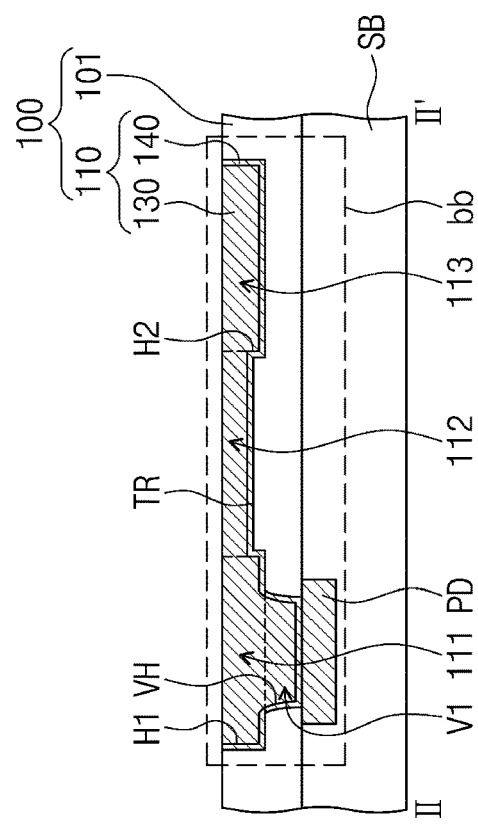
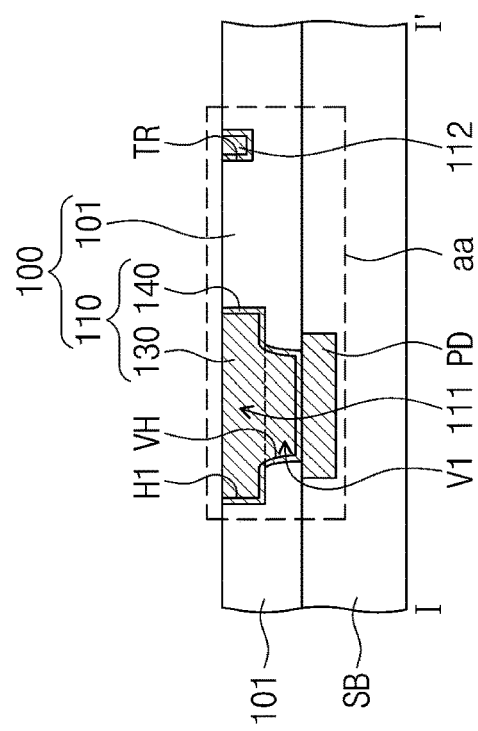

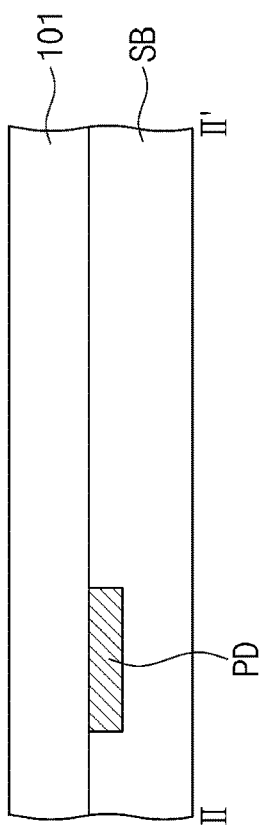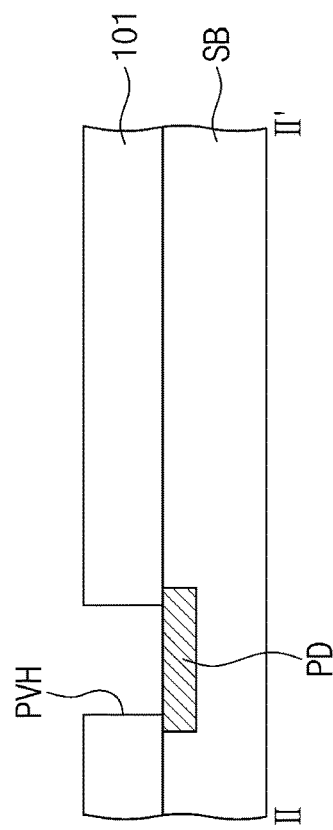
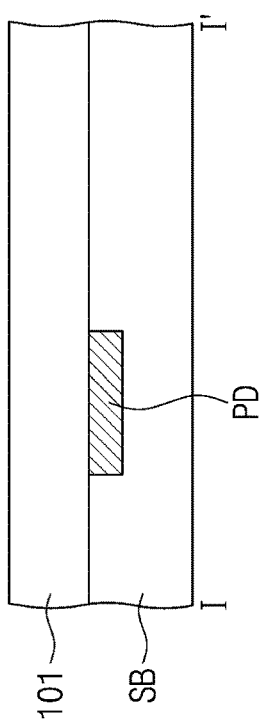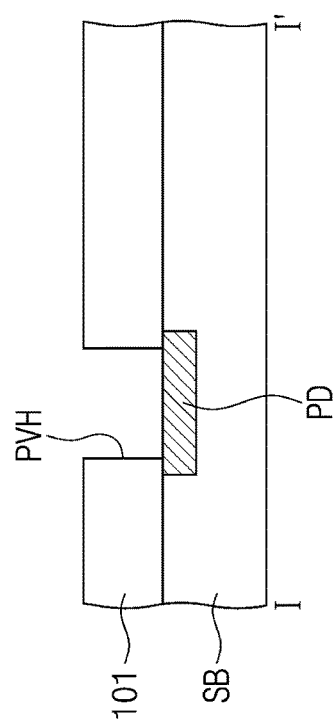

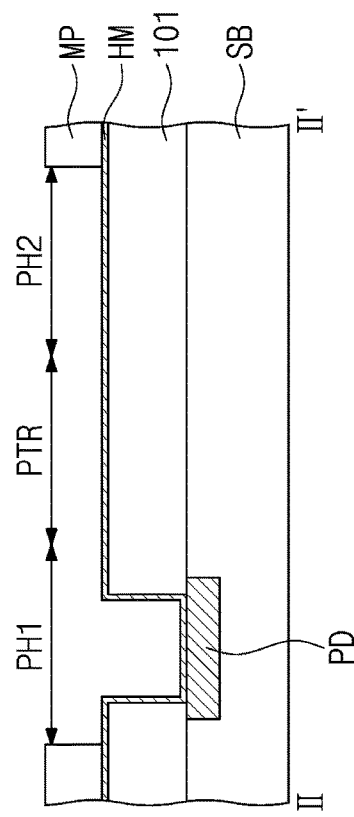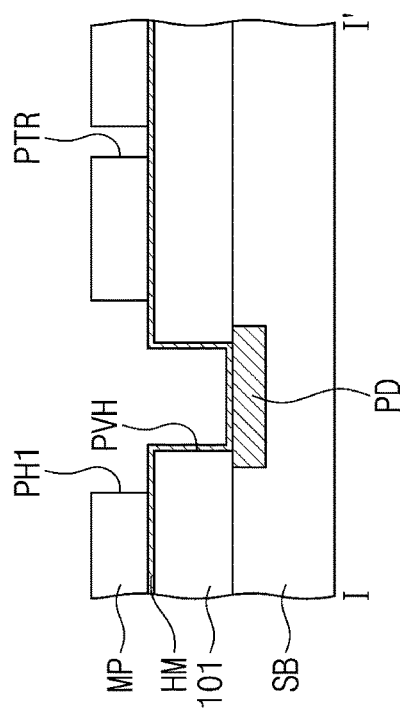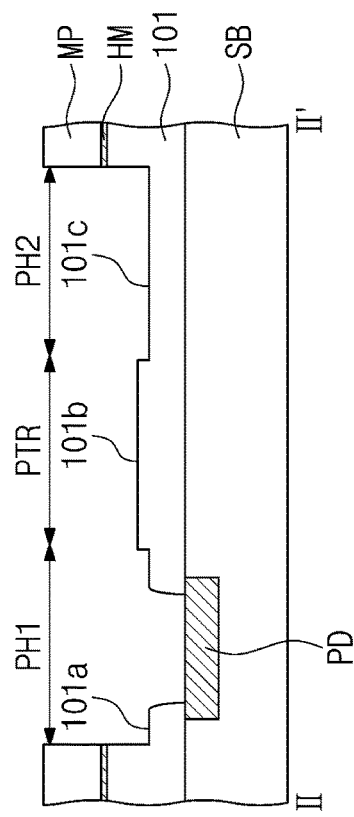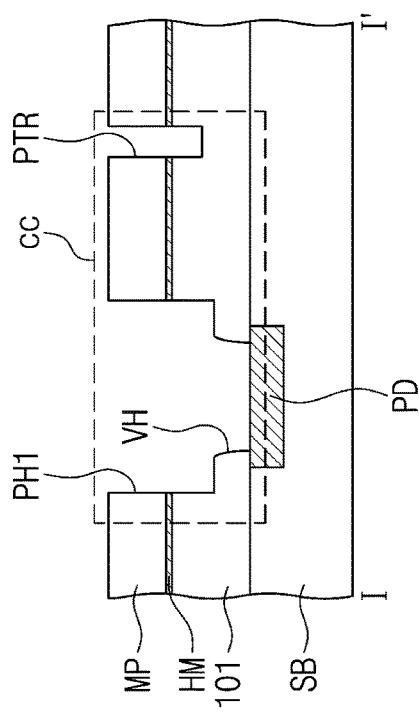

INTERCONNECTION STRUCTURE AND SEMICONDUCTOR PACKAGE INCLUDING THE SAME

CROSS-REFERENCE TO THE RELATED APPLICATIONS

This application is a Continuation of U.S. application Ser. No. 17/099,929, filed on Nov. 17, 2020, which claims priority under 35 U.S.C § 119 to Korean Patent Application No. 10-2020-0052231, filed on Apr. 29, 2020, in the Korean Intellectual Property Office, the disclosures of which are hereby incorporated by reference in their entireties.

BACKGROUND

Embodiments of the present disclosure relate to an interconnection structure and a semiconductor package including the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some example embodiments of the present disclosure provide an interconnection structure with improved reliability and a semiconductor package including the same.

According to some example embodiments of the present disclosure, a method for manufacturing a semiconductor package may include: forming a photoimageable dielectric layer on a substrate including a pad; forming a preliminary via hole in the photoimageable dielectric layer to expose the pad; forming a hard mask layer on the photoimageable dielectric layer and the pad; etching the photoimageable dielectric layer and the hard mask layer to form a via hole, a first hole, and a trench; forming a metal layer on the photoimageable dielectric layer connected to the pad; planarizing the metal layer to form a wiring pattern; and placing a semiconductor chip electrically connected to the wiring pattern. The first hole may be disposed on the via hole and connected thereto, and a diameter of the first hole may be larger than a diameter of the via hole. The etching the photoimageable dielectric layer and the hard mask layer may include placing a mask pattern including a first opening vertically overlapping the preliminary via hole and a second opening spaced apart from the first opening on the hard mask layer.

According to some example embodiments of the present disclosure, a method for manufacturing a semiconductor package may include: forming an dielectric layer on a substrate including a pad; forming a preliminary via hole in the dielectric layer to expose the pad; expanding the preliminary via hole to form a first hole and a via hole connected to the first hole; forming a trench spaced apart from the first hole and the via hole; forming a metal layer filling the first hole, the via hole, and the trench; planarizing the metal layer to form a wiring pattern; and electrically connecting the wiring pattern to a semiconductor chip. The forming the first hole, the via hole, and the trench may include forming a hard mask layer on the dielectric layer; and etching the dielectric layer and the hard mask layer using a dry etching process.

BRIEF DESCRIPTION OF THE DRAWINGS

FIG. 2A illustrates a cross-sectional view taken along line I-I' of FIG. 1.

FIG. 2B illustrates a cross-sectional view taken along line II-II' of FIG. 1.

FIG. 5A illustrates a first cross-sectional view taken along line I-I' showing a method of fabricating an interconnection structure according to some example embodiments of the present disclosure.

FIG. 5B illustrates a first cross-sectional view taken along line II-II' showing a method of fabricating an interconnection structure according to some example embodiments of the present disclosure.

FIG. 6A illustrates a second cross-sectional view taken along line I-I' showing the method of fabricating an interconnection structure according to some example embodiments of the present disclosure.

FIG. 6B illustrates a second cross-sectional view taken along line II-II' showing the method of fabricating an interconnection structure according to some example embodiments of the present disclosure.

FIG. 7A illustrates a third cross-sectional view taken along line I-I' showing the method of fabricating an interconnection structure according to some example embodiments of the present disclosure.

FIG. 7B illustrates a third cross-sectional view taken along line II-II' showing the method of fabricating an interconnection structure according to some example embodiments of the present disclosure.

FIG. 8A illustrates a fourth cross-sectional view taken along line I-I' showing the method of fabricating an interconnection structure according to some example embodiments of the present disclosure.

FIG. 8B illustrates a fourth cross-sectional view taken along line II-II' showing the method of fabricating an interconnection structure according to some example embodiments of the present disclosure.

DETAILED DESCRIPTION OF EMBODIMENTS

Some example embodiments of the present disclosure will now be described in detail with reference to the accompanying drawings to aid in clearly explaining the present disclosure.

Figure 1:
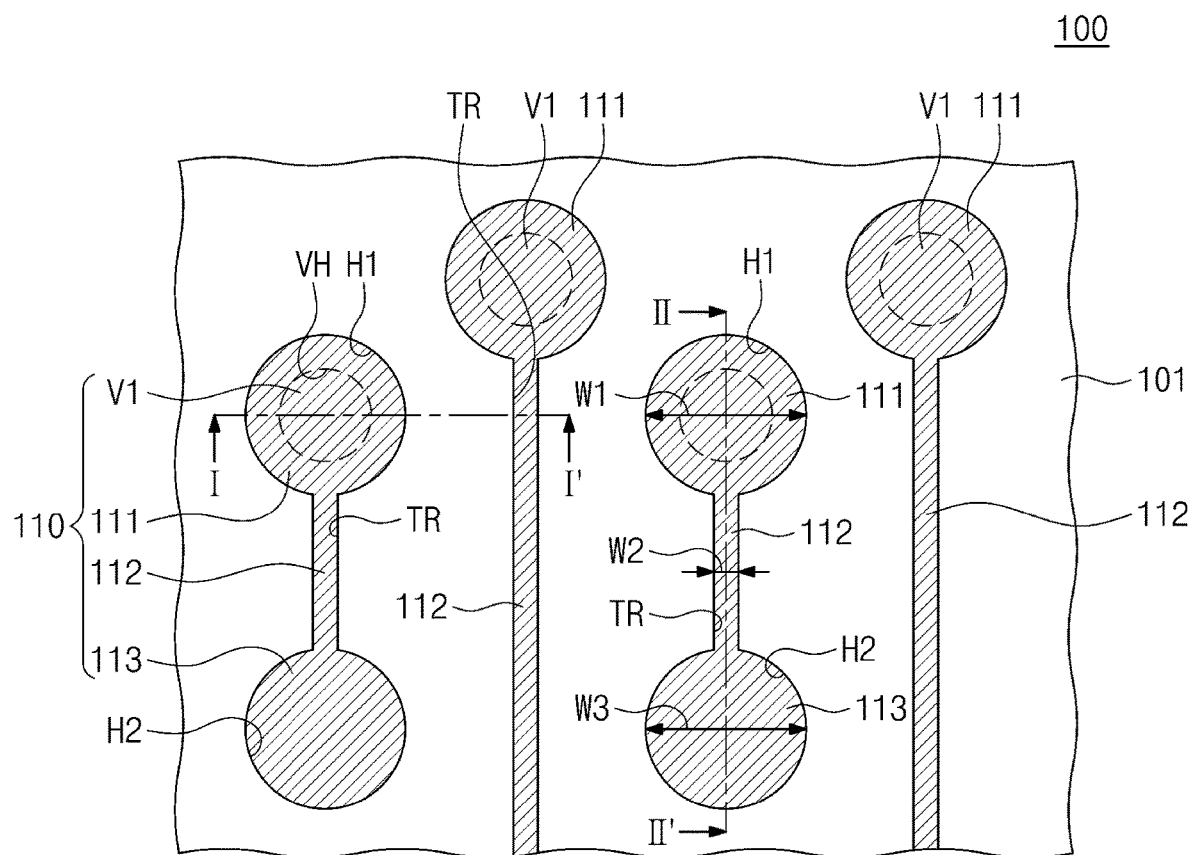
FIG. 1 illustrates a simplified plan view showing an interconnection structure according to some example embodiments of the present disclosure.

FIG. 1 illustrates a simplified plan view showing an interconnection structure according to some example embodiments of the present disclosure. FIG. 2A illustrates cross-sectional view taken along lines I-I' and II-II' of FIG. 1, respectively. The cross-sectional view taken along line I-I' also depicts cross-sections of wiring patterns, and the cross-sectional view taken along line II-II' also depicts a cross-section of one wiring pattern.

Referring to FIGS. 1 and 2A-B, an interconnection structure 100 may be provided on a substrate SB. The interconnection structure 100 may include a dielectric layer 101 and a plurality of a wiring pattern 110. The substrate SB may include on its top surface a plurality of a lower pad PD electrically connected to the plurality of the wiring pattern 110.

In this description, the interconnection structure 100 may be called an interconnection substrate, an interconnection layer, or a redistribution layer. Each wiring pattern 110 may be called a redistribution pattern.

The dielectric layer 101 may include, for example, a photoimageable dielectric polymer. The photoimageable dielectric polymer may include, for example, at least one selected from photosensitive polyimide, polybenzoxazole, phenolic polymers, and benzocyclobutene polymers.

The dielectric layer 101 may be provided therein with a plurality of a via hole VH, a plurality of a first hole H1, a plurality of a trench TR, and a plurality of a second hole H2. The plurality of the first hole H1 may be spatially connected to their underlying via hole VH. The plurality of the first hole H1 may be spatially connected to a respective trench TR, respectively. The plurality of the second hole H2 may also be spatially connected to a respective trench TR, and may also be spatially connected through the trench TR to a respective first hole H1. The via hole VH may expose at least a portion of a top surface of the lower pad PD.

The via hole VH and the first hole H1 may vertically overlap each other. The via hole VH and the first hole H1 may each have a circular shape or an almost circular shape when viewed in plan. The via hole VH and the first hole H1 may each have a tetragonal shape, a triangular shape, or any suitable shape without being limited to the circular shape.

The via hole VH may have a diameter less than that of the first hole H1. A bottom surface of the via hole VH, a sidewall of the via hole VH, a bottom surface of the first hole H1, and a sidewall of the first hole H1 may be sequentially connected to each other to form an injector or syringe shape.

The first hole H1, the trench TR, and the second hole H2 may have their diameters and/or widths in one direction. The trench TR may have a width W2 less than a diameter W1 of the first hole H1 and less than a diameter W3 of the second hole H2.

The wiring pattern 110 may be provided to fill the via hole VH, the first hole H1, the trench TR, and the second hole H2. Each wiring pattern 110 may have a damascene structure. Each wiring pattern 110 may include a via part V1 (e.g. a via body), a via pad part 111 (e.g. a via pad body), a line part 112 (e.g. a line body), and a connection pad part 113 (e.g. a connection pad body) that are integrally connected to each other. No boundary may be provided between the via part V1, the via pad part 111, the line part 112, and the connection pad part 113. The via pad part 111 may be provided on and may vertically overlap the via part V1. The line part 112 may have a linear shape extending from the via pad part 111. The connection pad part 113 may be connected to a distal end of the line part 112 and spaced apart from the via pad part 111 across the line part 112.

The via part V1 may be in physical contact with the lower pad PD. When another interconnection structure is disposed on the interconnection structure 100, the connection pad part 113 may be in physical contact with a via part of the another interconnection structure. The lower pad PD may correspond to a connection pad part of the another interconnection structure.

The via part V1 may be provided in the via hole VH. The via part V1 may have a shape corresponding to that of the first hole H1. The via pad part 111 may be provided in the first hole H1 and may have a shape corresponding to that of the first hole H1. The line part 112 may be provided in the trench TR and may have a shape corresponding to that of the trench TR. The connection pad part 113 may be provided in the second hole H2 and may have a shape corresponding to that of the second hole H2.

The wiring pattern 110 may include a seed/barrier pattern 140 and a conductive pattern 130. The seed/barrier pattern 140 may conformally cover the sidewall and the bottom surface of each of the via hole VH, the first hole H1, the trench TR, and the second hole H2. The seed/barrier pattern 140 may include, for example, titanium/copper (Ti/Cu). The conductive pattern 130 may include, for example, copper (Cu). The seed/barrier pattern 140 may be interposed between the conductive pattern 130 and the dielectric layer 101. The seed/barrier pattern 140 may not cover a top surface of the dielectric layer 101 or a top surface of the conductive pattern 130 of each of the via pad part 111, the line part 112, and the connection pad part 113. The conductive pattern 130 of the via part V1 and the conductive pattern 130 of the via pad part 111 may be integrally formed with each other and connected to each other without a boundary therebetween.

Figure 3:
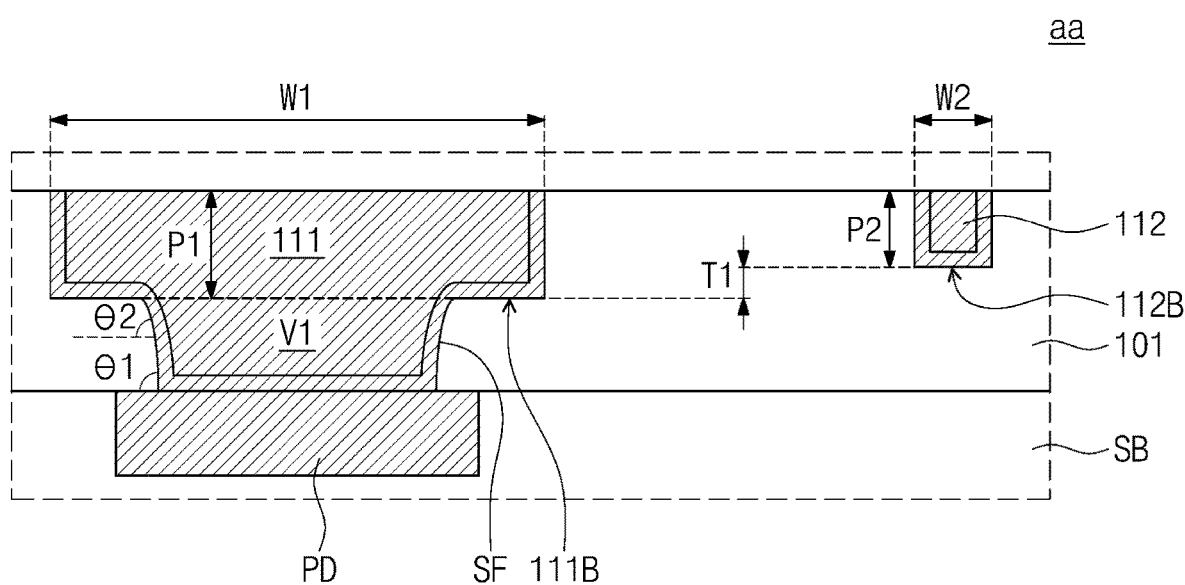
FIG. 3 illustrates an enlarged view showing section aa of FIG. 2.
Figure 4:
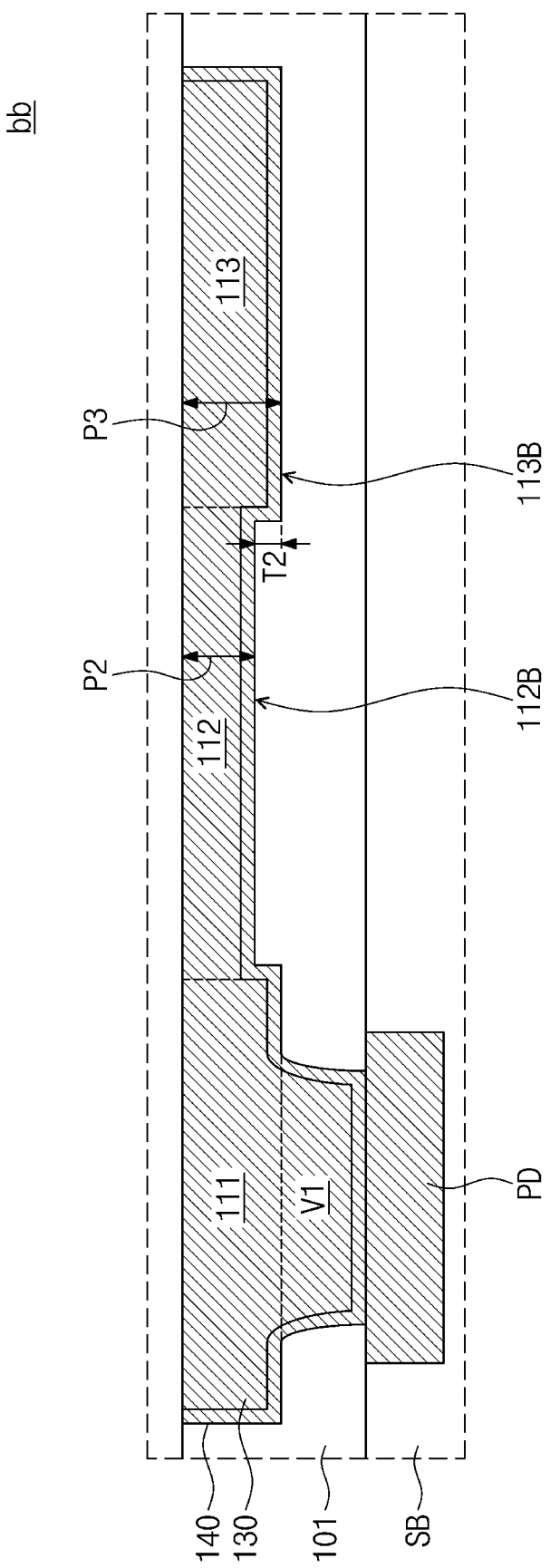
FIG. 4 illustrates an enlarged view showing section bb of FIG. 2.

FIG. 3 illustrates an enlarged view showing section aa of FIG. 2A. FIG. 4 illustrates an enlarged view showing section bb of FIG. 2B. Referring to FIGS. 2A to 4, the via part V1 may have a sidewall SF that is rounded. The sidewall SF of the via part V1 may have a slope that is changed with increasing distance in a vertical direction from the top surface of the substrate SB. For example, an angle between the top surface of the substrate SB and the sidewall SF of the via part V1 may become reduced from a first angle $\theta 1$ to a second angle $\theta 2$ as the sidewall SF approaches a top surface of the via part V1 from a bottom surface of the via part V1. The reduction in angle may cause the slope of the sidewall SF of the via part V1 to become gentler as approaching the top surface from the bottom surface of the via part V1.

The top surface of the via part V1 may be located at the same level as that of a bottom surface 111B of the via pad part 111. The bottom surface 111B of the via pad part 111 may be located at a lower level than that of a bottom surface 112B of the line part 112. For example, a level difference T1 between the bottom surface 111B of the via pad part 111 and the bottom surface 112B of the line part 112 may range from about 0.3 µm to about 0.8 µm.

The via pad part 111 may have a vertical width P1 ranging from about 3.8 µm to about 4.0 µm, and the line part 112 may have a vertical width P2 ranging from about 3.2 µm to about 3.5 µm. The vertical width P1 of the via pad part 111 may be about 1.1 times to about 1.25 times the vertical width P2 of the line part 112.

The via pad part 111 may have a diameter W1 greater than a width W2 of the line part 112. The diameter W1 of the via pad part 111 may be equal to or greater than about 7 times the width W2 of the line part 112. The width W2 of the line part 112 may be greater than about 0 µm and equal to or less than about 3 µm. For example, the diameter W1 of the via pad part 111 may be about 15 µm, and the width W2 of the line part 112 may be about 2 µm.

The connection pad part 113 may have a bottom surface 113B at a lower level than that of the bottom surface 112B of the line part 112. The connection pad part 113 may have a vertical width P3 less than the vertical width P2 of the line part 112. For example, a level difference T2 between the bottom surface 113B of the connection pad part 113 and the bottom surface 112B of the line part 112 may range from about 0.3 µm to about 0.8 µm.

Referring back to FIG. 1, the connection pad part 113 may have a diameter W3 less than the width W2 of the line part 112. The diameter W1 of the via pad part 111, the width W2 of the line part 112, and the diameter W3 of the connection pad part 113 may respectively correspond to the diameter of the first hole H1, the width of the trench TR, and the diameter of the second hole H2.

The previous description about the widths, the positional relationship between the bottom surface levels, or the like of the via pad part 111, the line part 112, and the connection pad part 113 may be identically applicable not only to one wiring pattern, but to a plurality of wiring patterns. For example, based on FIG. 2, when a wiring pattern 110 on a left side is called a first wiring pattern and a wiring pattern 110 on a right side is called a second wiring pattern, the first and second wiring patterns may transmit signals that are independent from each other. The bottom surface 111B of the via pad part 111 included in the first wiring pattern may be located at a lower level than that of the bottom surface 112B of the line part 112 included in the second wiring pattern.

The via pad part 111, the line part 112, the connection pad part 113, and the dielectric layer 101 may have respective top surfaces that are substantially coplanar with each other. The dielectric layer 101 may comprise or consist of a single layer that starts from the top surface of the line part 112 and reaches the bottom surface of the via part V1.

Figure 9:
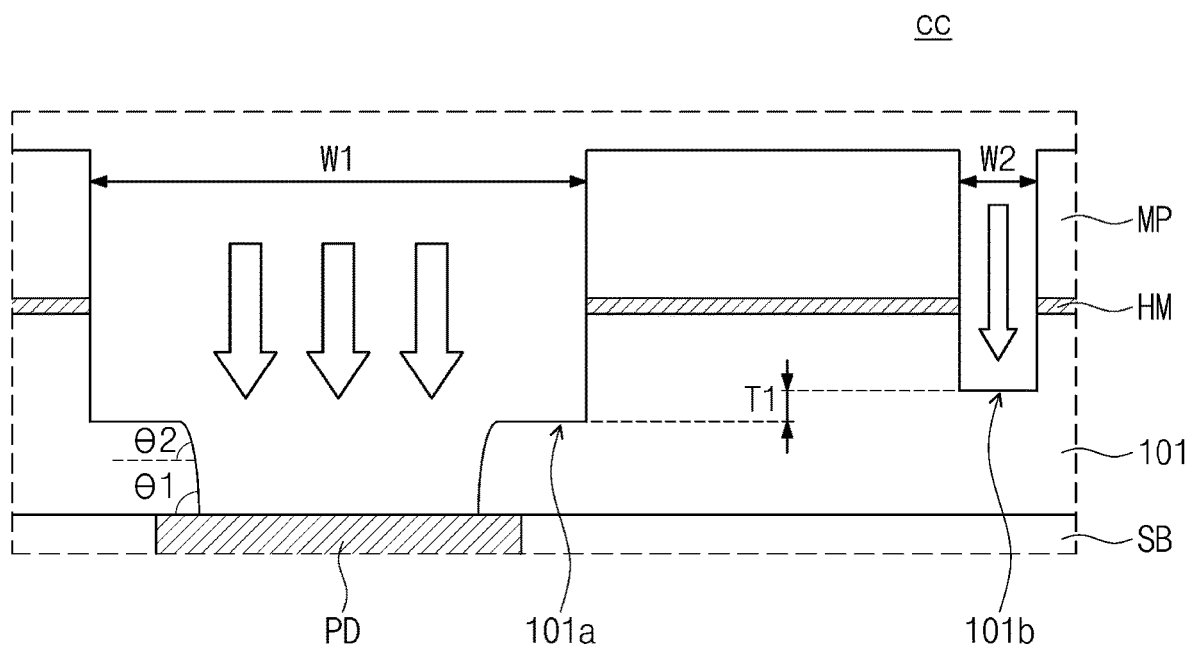
FIG. 9 illustrates an enlarged view showing section cc of FIG. 8.

FIGS. 5A to 8B, 10A-B, and 11A-B illustrate cross-sectional views showing a method of fabricating an interconnection structure according to some example embodiments of the present disclosure. FIG. 9 illustrates an enlarged view showing section cc of FIG. 8A.

Referring to FIGS. 5A-B, a dielectric layer 101 may be formed on a substrate SB. The formation of the dielectric layer 101 may be performed by a coating process, such as spin coating or slit coating. The dielectric layer 101 may include, for example, a photoimageable dielectric (PID) polymer. The photoimageable dielectric polymer may include, for example, at least one selected from photosensitive polyimide, polybenzoxazole, phenolic polymers, and benzocyclobutene polymers.

Referring to FIGS. 6A-B, a preliminary via hole PVH may be formed in the dielectric layer 101. The preliminary via hole PVH may expose a lower pad PD of the substrate SB. The dielectric layer 101 may be patterned by exposure and development processes. The exposure process may be a negative tone exposure process or a positive tone exposure process. Afterwards, a cure process may be performed on the dielectric layer 101.

Referring to FIGS. 7A-B, a hardmask layer HM may be formed to cover top and lateral surfaces of the dielectric layer 101, which lateral surface is exposed to the preliminary via hole PVH. The hardmask layer HM may cover an exposed top surface of the lower pad PD. The hardmask layer HM may include a metallic material having an etch selectivity with respect to the dielectric layer 101. The hardmask layer HM may include metal, such as titanium (Ti) or tantalum (Ta). The hardmask layer HM may be formed by, for example, physical vapor deposition (PVD), chemical vapor deposition (CVD), or atomic layer deposition (ALD).

A photoresist layer (not shown) may be formed on the hardmask layer HM. The photoresist layer may fill the preliminary via hole PVH. The photoresist layer may be formed by a coating process, such as spin coating or slit coating. The photoresist layer may include an organic material, such as a polymer. The photoresist layer may undergo a patterning process to form a mask pattern MP. The patterning process may include exposure and development processes. The mask pattern MP may include a first preliminary hole PH1, a preliminary trench PTR, and a second preliminary hole PH2. The first preliminary hole PH1, the preliminary trench PTR, and the second preliminary hole PH2 may partially expose the hardmask layer HM. The first preliminary hole PH1 may vertically overlap the preliminary via hole PVH.

Referring to FIGS. 8A-B and 9, the hardmask layer HM and the dielectric layer 101 may undergo a dry etching process in which the mask pattern MP is used as an etching mask. For example, an etching may be performed on a portion of the hardmask layer HM exposed by the mask pattern MP. After the hardmask layer HM is etched, the dielectric layer 101 below the hardmask layer HM may be partially etched. No etching may be performed on a portion of the hardmask layer HM that vertically overlaps the mask pattern MP.

The partial etching of the dielectric layer 101 below the hardmask layer HM may allow the first preliminary hole PH1, the preliminary trench PTR, and the second preliminary hole PH2 to have their increased depths. The preliminary via hole PVH may be changed into a via hole VH, which may have a depth less than that of the preliminary via hole PVH. In this description, the language "depth" may mean a width in a direction perpendicular to a top surface of the substrate SB.

During the etching process, a rate of an increase in depth of the first preliminary hole PH1 and the second preliminary hole PH2 may be greater than a rate of an increase in depth of the preliminary trench PTR. For example, the hardmask layer HM and the dielectric layer 101 may be etched at a higher rate in the first preliminary hole PH1 and the second preliminary hole PH2 than in the preliminary trench PTR. A diameter W1 of the first preliminary hole PH1 may be equal to or greater than about 7 times a width W2 of the preliminary trench PTR. The width W2 of the preliminary trench PTR may be extremely small, for example, greater than about 0 μm and equal to or less than about 3 μm, and thus during the etching process, a space capable of receiving an etchant may be much narrower in the preliminary trench PTR than in the first preliminary hole PH1. Therefore, a loading effect may etch the hardmask layer HM and the dielectric layer 101 at a lower rate in the preliminary trench PTR than in the first preliminary hole PH1.

As a result, after the etching process is completed, the first preliminary hole PH1 and the second preliminary hole PH2 may respectively have a bottom surface 101a and a bottom surface 101c each of which is located at a lower level than that of a bottom surface 101b of the preliminary trench PTR. For example, a level difference T1 between the bottom surface 101a of the first preliminary hole PH1 and the bottom surface 101b of the preliminary trench PTR may range from about 0.3 μm to about 0.8 μm.

According to the present disclosure, the hardmask layer HM covering a sidewall of the via hole VH may be etched, and the dielectric layer 101 may also be partially etched. Therefore, the via hole VH may be formed to have a rounded sidewall. The sidewall of the via hole VH may have a slope that decreases from a first angle θ1 to a second angle θ2 with increasing distance from the lower pad PD.

The second preliminary hole PH2 may be etched faster than the preliminary trench PTR. After the etching process, the bottom surface 101c of the second preliminary hole PH2 may be located at a lower level than that of the bottom surface 101b of the preliminary trench PTR.

Figure 10A:
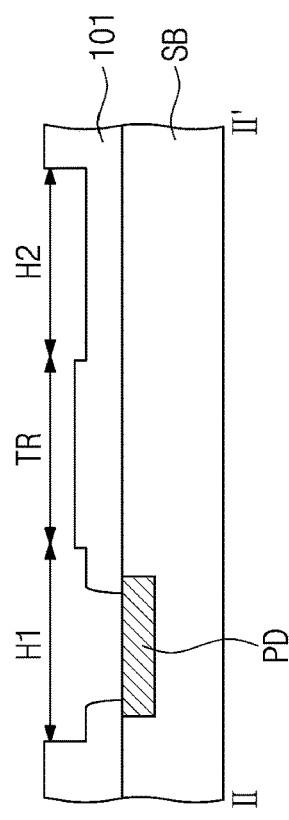
FIG. 10A illustrates a fifth cross-sectional view taken along line I-I' showing the method of fabricating an interconnection structure according to some example embodiments of the present disclosure.
Figure 10B:
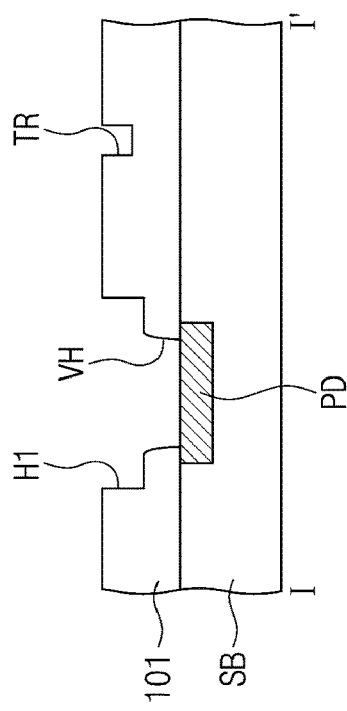
FIG. 10B illustrates a fifth cross-sectional view taken along line II-II' showing the method of fabricating an interconnection structure according to some example embodiments of the present disclosure.

Referring to FIGS. 10A-B, an ashing process may be employed to remove a remaining portion of the mask pattern MP and a remaining portion of the hardmask layer HM. As the mask pattern MP and the hardmask layer HM are removed, the first preliminary hole PH1 may be formed into a first hole H1, the preliminary trench PTR may be formed into a trench TR, and the second preliminary hole PH2 may be formed into a second hole H2.

Figure 11A:
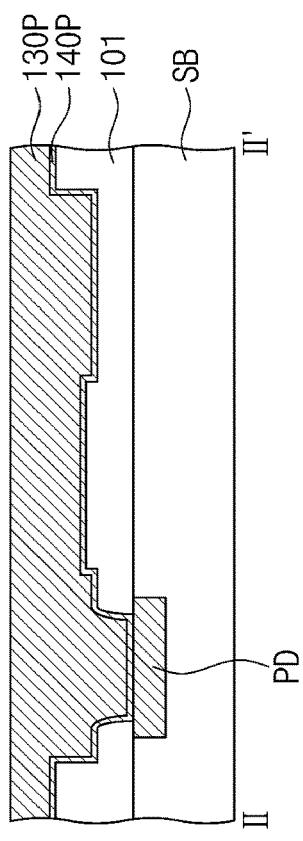
FIG. 11A illustrates a sixth cross-sectional view taken along line I-I' showing the method of fabricating an interconnection structure according to some example embodiments of the present disclosure.
Figure 11B:
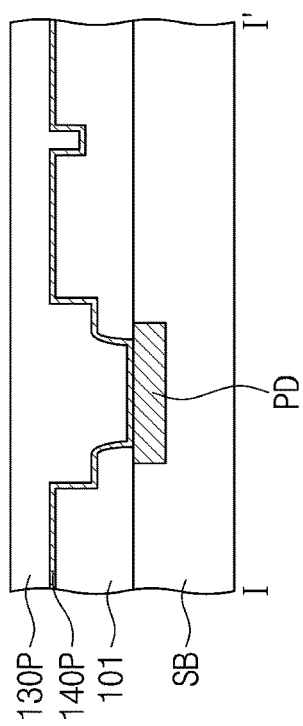
FIG. 11B illustrates a sixth cross-sectional view taken along line II-II' showing the method of fabricating an interconnection structure according to some example embodiments of the present disclosure.

Referring to FIGS. 11A-B, a seed/barrier layer 140P may be formed to conformally cover a sidewall and a bottom surface of the via hole VH, a sidewall and a bottom surface of the first hole H1, a sidewall and a bottom surface of the trench TR, a sidewall and a bottom surface of the second hole H2, and the top surface of the dielectric layer 101. The seed/barrier layer 140P may include a conductive material, for example, titanium/copper (Ti/Cu).

A conductive layer 130P may be formed on the seed/barrier layer 140P, thereby filling the via hole VH, the first hole H1, the trench TR, and the second hole H2. The conductive layer 130P may be formed by performing an electroplating process in which the seed/barrier layer 140P is used as an electrode. The conductive layer 130P may include metal, such as copper, and may extend onto the top surface of the dielectric layer 101.

Referring back to FIG. 2, the seed/barrier layer 140P and the conductive layer 130P may undergo a planarization process to form a seed/barrier pattern 140 and a conductive pattern 130. The planarization process may include, for example, a chemical mechanical polishing process. The planarization process may continue until the top surface of the dielectric layer 101 is exposed.

The seed/barrier pattern 140 and the conductive pattern 130 may be localized in each of the via hole VH, the first hole H1, the second hole H2, and the trench TR. Accordingly, a wiring pattern 110 may be formed. The wiring pattern 110 may include the seed/barrier pattern 140 and the conductive pattern 130. The planarization process may cause the wiring pattern 110 to have a top surface that is relatively flat and is coplanar with the top surface of the dielectric layer 101.

After a via hole is formed, a first hole, a trench, and a second hole may be defined by a photopatterning process (e.g., photolithography), not an etching process. For example, instead of forming a photoresist layer and performing a dry etching process according to the present disclosure, a photoimageable dielectric layer may be coated, exposed, developed, and cured twice to form the first hole, the second hole, and the trench.

When the photopatterning process is used to open a region corresponding to a via pad part (or the first preliminary hole PH1) and a region corresponding to a line part (or the preliminary trench PTR), a large difference may be provided between the width W1 of the region corresponding the first preliminary hole PH1 and the width W2 of the region corresponding to the preliminary trench PTR, with the result that it may be difficult to perform the patterning process to the satisfaction of requirements for the regions at the same time.

For example, there may be problems associated either with collapse of the mask pattern MP that opens the region corresponding to the line part or with not-open issues occurring at the mask pattern MP on the region corresponding the via pad part. When the width W2 of the line part is extremely small, defects may arise in simultaneously patterning both the region corresponding to the via pad part and the region corresponding to the line part.

According to the present disclosure, a dry etching process may be employed to solve the aforementioned problems occurring when opening the region corresponding to the via pad part and the region corresponding to the line part, which may result in an increase in reliability in forming interconnection structures. Moreover, a metallic hardmask layer may facilitate a fine patterning process, and thus it may be possible to form fine interconnection structures and to increase reliability of the interconnection structures.

Figure 12:
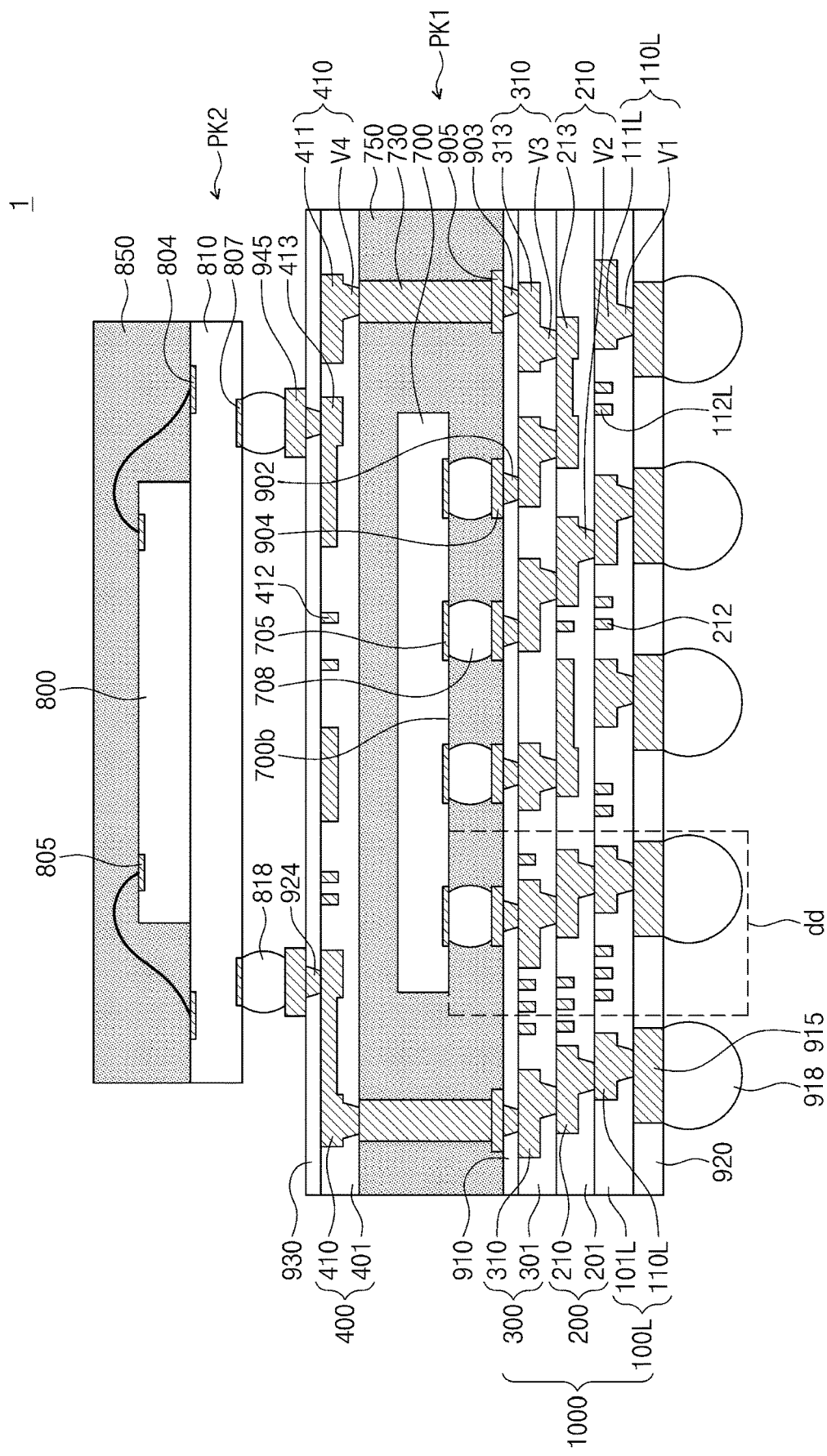
FIG. 12 illustrates a cross-sectional view showing a semiconductor package including an interconnection structure according to some example embodiments of the present disclosure.
Figure 13:
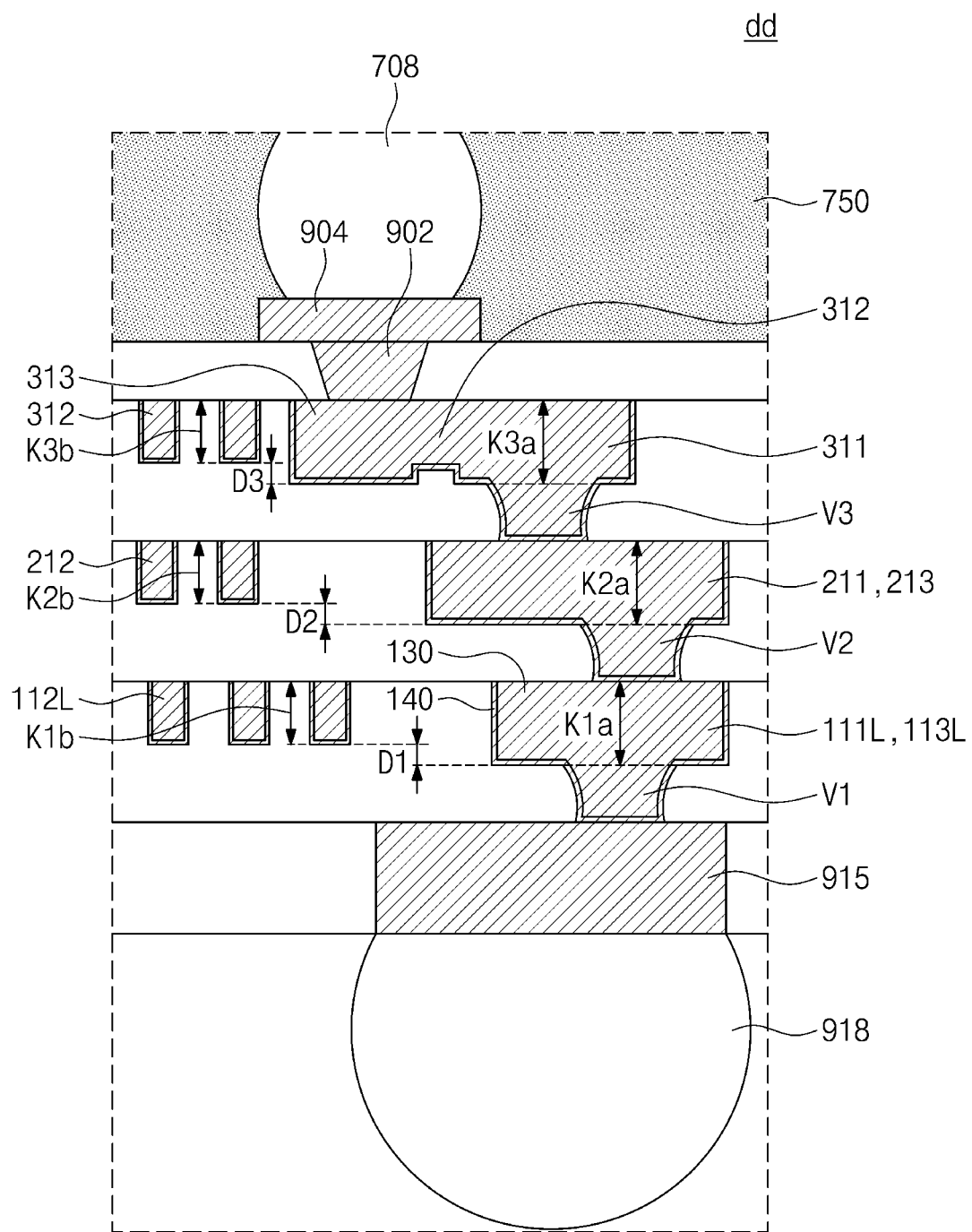
FIG. 13 illustrates an enlarged view showing section dd of FIG. 12.

FIG. 12 illustrates a cross-sectional view showing a semiconductor package in which an interconnection structure according to an embodiment of the present disclosure is applicable to a redistribution layer. FIG. 13 illustrates an enlarged view showing section dd of FIG. 12. Except for the following description, some repetitive descriptions discussed above with reference to FIGS. 1 to 4 will be omitted below.

Referring to FIGS. 12 and 13, a semiconductor package 1 may include a first semiconductor package PK1 and a second semiconductor package PK2 on the first semiconductor package PK1.

The first semiconductor package PK1 may include a redistribution substrate 1000 (e.g. a lower redistribution substrate), a first semiconductor chip 700, an upper redistribution substrate 400, and a first molding member 750 (e.g. a molding body).

The redistribution substrate 1000 may include a first redistribution layer 100L, a second redistribution layer 200, and a third redistribution layer 300 that are sequentially stacked. The first redistribution layer 100L, the second redistribution layer 200, and the third redistribution layer 300 may each be the same as or similar to the interconnection structure 100 discussed above with reference to FIGS. 1 to 4. FIGS. 12 and 13 show that the redistribution substrate 1000 includes three redistribution layers, but at least one redistribution layer may be added to or omitted from the redistribution substrate 1000.

The first redistribution layer 100L may include first redistribution patterns 110L and a first dielectric layer 101L. The second redistribution layer 200 may include second redistribution patterns 210 and a second dielectric layer 201. The third redistribution layer 300 may include third redistribution patterns 310 and a third dielectric layer 301.

Each of the first, second, and third redistribution patterns 110L, 210, and 310 may include a seed/barrier pattern 140 and a conductive pattern 130.

The seed/barrier pattern 140 may include copper/titanium. The conductive pattern 130 may include copper.

Each of the first redistribution patterns 110L may include a first via part V1, a first via pad part 111L, a first line part 112L, and a first connection pad part 113L that are integrally connected to each other. The first via part V1 may be provided on and in contact with one of the terminal pads 915 which will be discussed below. The first via pad part 111L may be provided on and connected to the first via part V1. The first line part 112L may have a linear shape that extends from the first via pad part 111L. The first connection pad part 113L may be connected to a distal end of the first line part 112L, and may be in contact with a second via part V2 of the second redistribution layer 200 which will be discussed below.

Each of the second redistribution patterns 210 may include a second via part V2, a second via pad part 211, a second line part 212, and a second connection pad part 213 that are integrally connected to each other. The second via pad part 211 may be provided on and connected to the second via part V2. The second line part 212 may have a linear shape that extends from the second via pad part 211. The second connection pad part 213 may be connected to a distal end of the second line part 212, and may be in contact with a third via part V3 of the third redistribution layer 300 which will be discussed below.

Each of the third redistribution patterns 310 may include a third via part V3, a third via pad part 311, a third line part 312, and a third connection pad part 313 that are integrally connected to each other.

The third via pad part 311 may be provided on and connected to the third via part V3. The third line part 312 may have a linear shape that extends from the third via pad part 311. The third connection pad part 313 may be connected to a distal end of the third line part 312, and may be in contact with one of first upper conductive vias 902 or one of second upper conductive vias 903 that are provided in a first passivation layer 910 which will be discussed below.

The first via pad part 111L (or the first connection pad part 113L) may have a bottom surface at a lower level than that a bottom surface of the first line part 112L, and a level difference D1 between the bottom surfaces may range from about 0.3 μm to about 0.8 μm. The first via pad part 111L (or the first connection pad part 113L) may have a vertical width K1$a$ greater than a vertical width K1$b$ of the first line part 112L, and a vertical width difference may range from about 0.3 μm to about 0.8 μm.

The second via pad part 211 (or the second connection pad part 213) may have a bottom surface at a lower level than that of a bottom surface of the second line part 212, and a level difference D2 between the bottom surfaces may range from about 0.3 μm to about 0.8 μm. The second via pad part 211 (or the second connection pad part 213) may have a vertical width K2$a$ greater than a vertical width K2$b$ of the second line part 212, and a vertical width difference may range from about 0.3 μm to about 0.8 μm.

The third via pad part 311 (or the third connection pad part 313) may have a bottom surface at a lower level than that of a bottom surface of the third line part 312, and a level difference D3 between the bottom surfaces may range from about 0.3 μm to about 0.8 μm. The third via pad part 311 (or the third connection pad part 313) may have a vertical width K3$a$ greater than a vertical width K3$b$ of the third line part 312, and a vertical width difference may range from about 0.3 μm to about 0.8 μm.

The first, second, and third redistribution patterns 110L, 210, and 310 may be electrically connected to each other.

A first passivation layer 910 may be provided on the third redistribution layer 300. The first passivation layer 910 may have therein first upper conductive vias 902 and second upper conductive vias 903. The first upper conductive vias 902 and the second upper conductive vias 903 may each be in contact with the third connection pad part 313 of the third redistribution patterns 310.

First upper conductive pads 904 may be provided on and in contact with corresponding first upper conductive vias 902. Second upper conductive pads 905 may be provided on and in contact with corresponding second upper conductive vias 903. The first upper conductive pads 904 and the second upper conductive pads 905 may include one of Ni/Cu and Cu/Ni/Au.

The first semiconductor chip 700 may be provided on the first passivation layer 910. The first semiconductor chip 700 may be, for example, a logic chip. The first semiconductor chip 700 may include a semiconductor substrate, integrated circuits on the semiconductor substrate, wiring lines coupled to the integrated circuits, and first chip pads 705 coupled to the wiring lines. The first chip pads 705 may be provided on one surface 700$b$ of the first semiconductor chip 700. The first chip pads 705 may be electrically connected through the wiring lines to the integrated circuits of the first semiconductor chip 700.

The first semiconductor chip 700 may be disposed on the redistribution substrate 1000 to allow the first chip pads 705 of the first semiconductor chip 700 to face the redistribution substrate 1000. First connection terminals 708 may be provided between the first upper conductive pads 904 and the first chip pads 705, and may be electrically connected to the first upper conductive pads 904. The first semiconductor chip 700 may be electrically connected through the first connection terminals 708 to the redistribution substrate 1000. In this description, the phrase of "electrically connected to the redistribution substrate 1000" may mean that "electrically connected to at least one selected from the first, second, and third redistribution layers 100L, 200, and 300." The first connection terminals 708 may include at least one selected from solder, pillar, and bump. The first connection terminals 708 may include a conductive material, such as metal.

One or more conductive structures 730 may be provided on the redistribution substrate 1000 and in the first molding member 750. The conductive structures 730 may be laterally spaced apart from the first semiconductor chip 700. The conductive structures 730 may be in contact with one of the second upper conductive pads 905. The conductive structures 730 may be electrically connected through the first, second, and third redistribution patterns 110L, 210, and 310 to external coupling terminals 918 or the first semiconductor chip 700. The conductive structures 730 may include a metal pillar. The metal pillar may include, for example, copper. The conductive structures 730 may have a height of, for example, about 200 μm.

The first molding member 750 may be provided on and may cover the redistribution substrate 1000. The first molding member 750 may cover the first passivation layer 910.

The first molding member 750 may extend into a gap between the first semiconductor chip 700 and the first passivation layer 910, thereby encapsulating the first connection terminals 708. Alternatively, an under-fill pattern (not shown) may be provided in a gap between the first passivation layer 910 and the first semiconductor chip 700. The first molding member 750 may expose a top surface of the conductive structures 730, while covering a sidewall of the conductive structures 730.

A second passivation layer 920 may be provided on another surface of the redistribution substrate 1000. The second passivation layer 920 may include a dielectric material and may have terminal pads 915 therein. The terminal pads 915 may be in contact with the first via part V1 of one of the first redistribution patterns 110L. The external coupling terminals 918 may be provided on the terminal pads 915. The external coupling terminals 918 may be in contact with the terminal pads 915.

The terminal pads 915 may include a conductive material, such as copper, nickel, or any alloy thereof. The external coupling terminals 918 may include a conductive material, such as an alloy of tin/silver (SnAg). The external coupling terminals 918 may include at least one selected from solder, pillar, and bump. The external coupling terminals 918 may be formed by solder ball attachment or electroplating. When one of the terminal pads 915 includes copper, an intermetallic compound such as $Cu_2Sn$ or $Cu_6Sn_5$ may be present between the one of the terminal pads 915 and a corresponding one of the external coupling terminals 918. When one of the terminal pads 915 includes nickel, an intermetallic compound such as $Ni_3Sn_4$ may be present between the one of the terminal pads 915 and a corresponding one of the external coupling terminals 918.

The external coupling terminals 918 may be coupled to the first chip pads 705 through a corresponding one of the terminal pads 915 and the first, second, and third redistribution layers 100L, 200, and 300. The external coupling terminals 918 may not be vertically aligned with the first chip pads 705. The external coupling terminals 918 may be provided in plural, and at least one of the external coupling terminals 918 may not vertically overlap the first semiconductor chip 700. Therefore, the external coupling terminals 918 may increase in the degree of freedom of arrangement. The semiconductor package 1 may be a fan-out semiconductor package.

The upper redistribution substrate 400 or an upper redistribution layer may be disposed on the top surface of at least one of the conductive structures 730 or a top surface of the first molding member 750. The upper redistribution substrate 400 may include a fourth dielectric layer 401 and one or more of the fourth redistribution pattern 410. The upper redistribution substrate 400 may be substantially the same as one of the first, second, and third redistribution layers 100L, 200, and 300 discussed above.

The fourth dielectric layer 401 may be formed of a photoimageable dielectric layer, and may include a fourth seed/barrier pattern and a fourth conductive pattern.

The fourth redistribution pattern 410 may include a fourth via part V4, a fourth via pad part 411, a fourth line part 412, and a fourth connection pad part 413 that are integrally connected to each other. The fourth via part V4 may be provided on at least one of the conductive structures 730, and the fourth via pad part 411 may be connected to the fourth via part V4.

The upper redistribution substrate 400 is illustrated to include a single upper redistribution layer, but at least one redistribution layer may be additionally included in the upper redistribution substrate 400.

A third passivation layer 930 may be provided on the upper redistribution substrate 400. The third passivation layer 930 may have vias 924 therein. The vias 924 may be in contact with a plurality of the fourth connection pad part 413 of the fourth redistribution pattern 410. Pads 945 may be provided on the vias 924.

The second semiconductor package PK2 may include a package substrate 810, a second semiconductor chip 800, and a second molding member 850. The package substrate 810 may be a printed circuit board or a redistribution layer. Metal pads 804 and 807 may be disposed on opposite surfaces of the package substrate 810.

The second semiconductor chip 800 may be a memory chip, for example, DRAM or NAND Flash. The second semiconductor chip 800 may be of a different type from that of the first semiconductor chip 700. The second semiconductor chip 800 may have on its surface a plurality of second chip pads 805 that are wire-bonded to the metal pads 804 of the package substrate 810.

Package coupling terminals 818 may be disposed between the first semiconductor package PK1 and the second semiconductor package PK2. The package coupling terminals 818 may be interposed between and electrically connected to the pads 945 and the metal pads 807. Therefore, the second semiconductor package PK2 may be electrically connected to the first semiconductor chip 700 and the external coupling terminals 918 through the package coupling terminals 818, the upper redistribution substrate 400, and the conductive structures 730.

Figure 14:
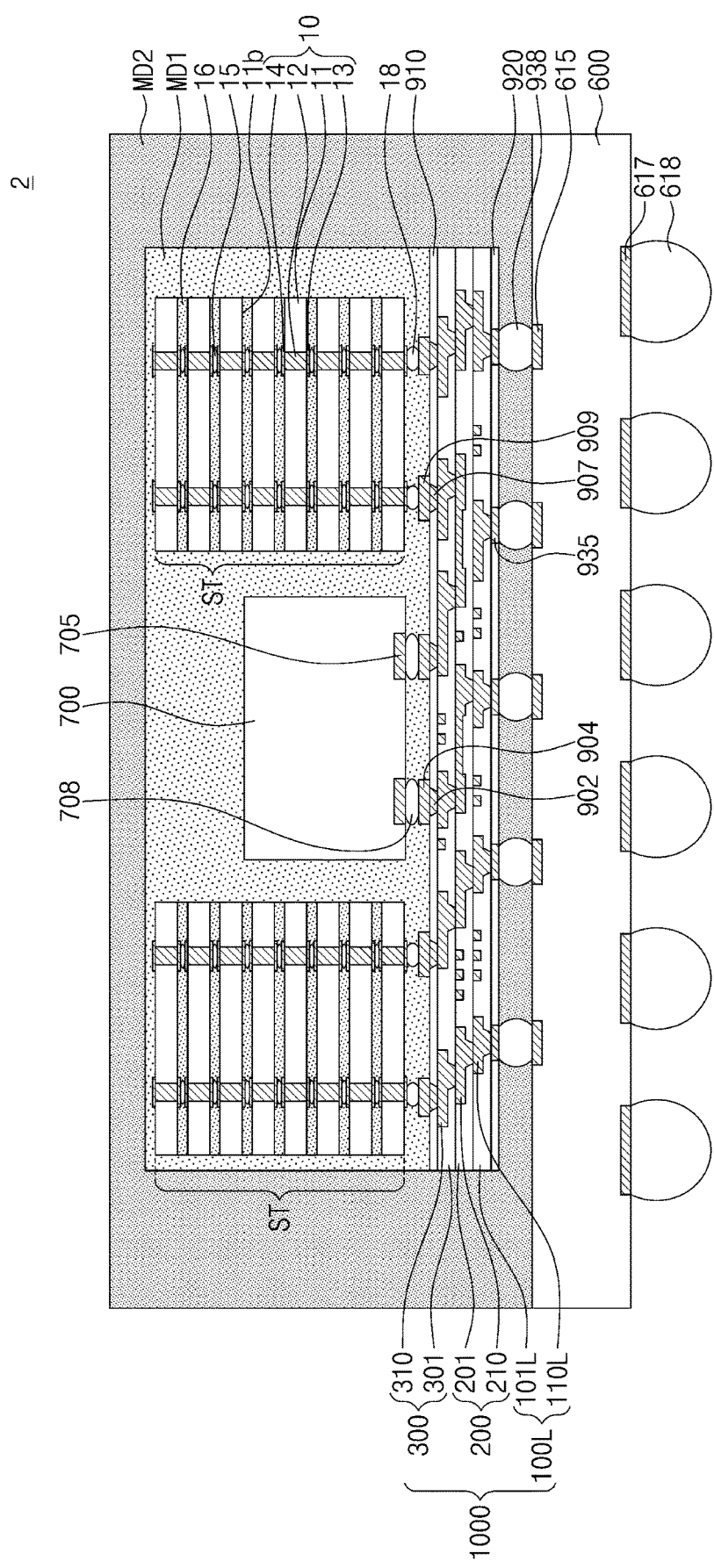
FIG. 14 illustrates a cross-sectional view showing a semiconductor package including an interconnection structure according to some example embodiments of the present disclosure.

FIG. 14 illustrates a cross-sectional view showing a semiconductor package in which an interconnection structure according to the present disclosure is applicable to a redistribution layer. Repetitive descriptions given with reference to FIG. 12 will be avoided.

Referring to FIG. 14, a semiconductor package 2 may include a package substrate 600, a redistribution substrate 1000, a first semiconductor chip 700, and second semiconductor chip stacks ST. In embodiments of the present disclosure, the redistribution substrate 1000 may serve as an interposer and may be called a redistribution interposer.

The package substrate 600 may be, for example, a printed circuit board (PCB). The first semiconductor chip 700 may be substantially the same as the first semiconductor chip 700 discussed in FIG. 13. FIG. 14 shows a plurality of semiconductor chip stacks ST, but a single one of the second semiconductor chip stacks ST may be provided.

The second semiconductor chip stacks ST may each include a plurality of second semiconductor chips 10 that are stacked in a vertical direction. The second semiconductor chips 10 may be provided with an adhesive layer 16 therebetween, for example, a non-conductive film (NCF).

Each of the second semiconductor chips 10 may include a semiconductor substrate 11, through vias 12 that penetrate the semiconductor substrate 11, first conductive pads 13 connected to corresponding through vias 12, and second conductive pads 14 connected to corresponding through vias 12. Between the second semiconductor chips 10 may be provided bumps 15, each of which is in contact with one of the first conductive pads 13 and one of the second conductive pads 14.

The semiconductor substrate 11 may be a wafer-level substrate. The semiconductor substrate 11 may include silicon or germanium. The semiconductor substrate 11 may include a circuit layer (not shown) provided adjacent to a first surface 11b thereof. The circuit layer may include an integrated circuit (e.g., memory circuit). The through vias 12 may be electrically connected to the integrated circuit. The through vias 12 may include a conductive material. The first conductive pads 13 and the second conductive pads 14 may include metal, such as copper or aluminum.

Each of the second semiconductor chips 10 may have a function different from that of the first semiconductor chip 700. For example, the first semiconductor chip 700 may be a logic chip (e.g., an application processor), and the second semiconductor chips 10 may be memory chips.

The redistribution substrate 1000 (e.g. a redistribution interposer) illustrated in FIG. 14 may be identical or similar to the redistribution substrate 1000 discussed with respect to FIG. 12. For example, the redistribution substrate 1000 may include the first redistribution layer 100L, the second redistribution layer 200, and the third redistribution layer 300. The number of the redistribution layers 100L, 200, and 300 is not limited thereto, but may be variously changed.

A first passivation layer 910 may be provided on one surface of the redistribution substrate 1000. The first passivation layer 910 may include a dielectric material, and may have therein first upper conductive vias 902 and second upper conductive vias 907. The first upper conductive vias 902 and the second upper conductive vias 907 may each be in contact with the third connection pad part 313 of the third redistribution patterns 310.

First upper conductive pads 904 may be provided on the first upper conductive vias 902, and second upper conductive pads 909 may be provided on the second upper conductive vias 907. First connection terminals 708 may be provided on the first upper conductive pads 904, and second connection terminals 18 may be provided on the second upper conductive pads 909.

The first semiconductor chip 700 may have first chip pads 705 connected through the first connection terminals 708 to the first upper conductive pads 904. The first conductive pads 13 of one of the second semiconductor chips 10 at a lowermost position of the second semiconductor chip stacks ST may be connected through the second connection terminals 18 to the second upper conductive pads 909.

The first semiconductor chip 700 and the second semiconductor chip stacks ST may be electrically connected to each other through at least one selected from the first, second, and third redistribution layers 100L, 200, and 300.

A first molding member MD1 may be provided to cover a top surface of the redistribution substrate 1000, top and lateral surfaces of the first semiconductor chip 700, and top and lateral surfaces of the second semiconductor chip stacks ST. The first molding member MD1 may encapsulate the first connection terminals 708 and the second connection terminals 18. In some example embodiments, an under-fill pattern may be provided to fill a gap between the redistribution substrate 1000 and the first semiconductor chip 700, and other under-fill patterns may be provided to fill a gap between the redistribution substrate 1000 and the second semiconductor chip stacks ST.

A second passivation layer 920 may be provided on another surface of the redistribution substrate 1000. The second passivation layer 920 may have therein a plurality of connection pads 935. The connection pads 935 may be electrically connected to the first redistribution patterns 110L. For example, the first via part V1 of the first redistribution patterns 110L may be in contact with a corresponding one of the connection pads 935.

The package substrate 600 may have a first surface and a second surface that face away from each other, wherein the first surface may be provided with first pads 615 thereon and the second surface may be provided with second pads 617 thereon. The connection pads 935 and the first pads 615 may be connected to each other through connection terminals 938.

The package substrate 600 may have therein wiring lines, through which the first pads 615 may be connected to the second pads 617. The second pads 617 may be provided with external coupling terminals 618 thereon. The external coupling terminals 618 may be mounted on an external substrate such as a motherboard.

The package substrate 600 may be provided on its one surface with a second molding member MD2 that covers the package substrate 600. The second molding member MD2 may cover top and lateral surfaces of the first molding member MD1 and a lateral surface of the redistribution substrate 1000. The second molding member MD2 may extend to encapsulate the connection terminals 938. In some example embodiments, an under-fill pattern may be provided between the redistribution substrate 1000 and the package substrate 600.

Figure 15:
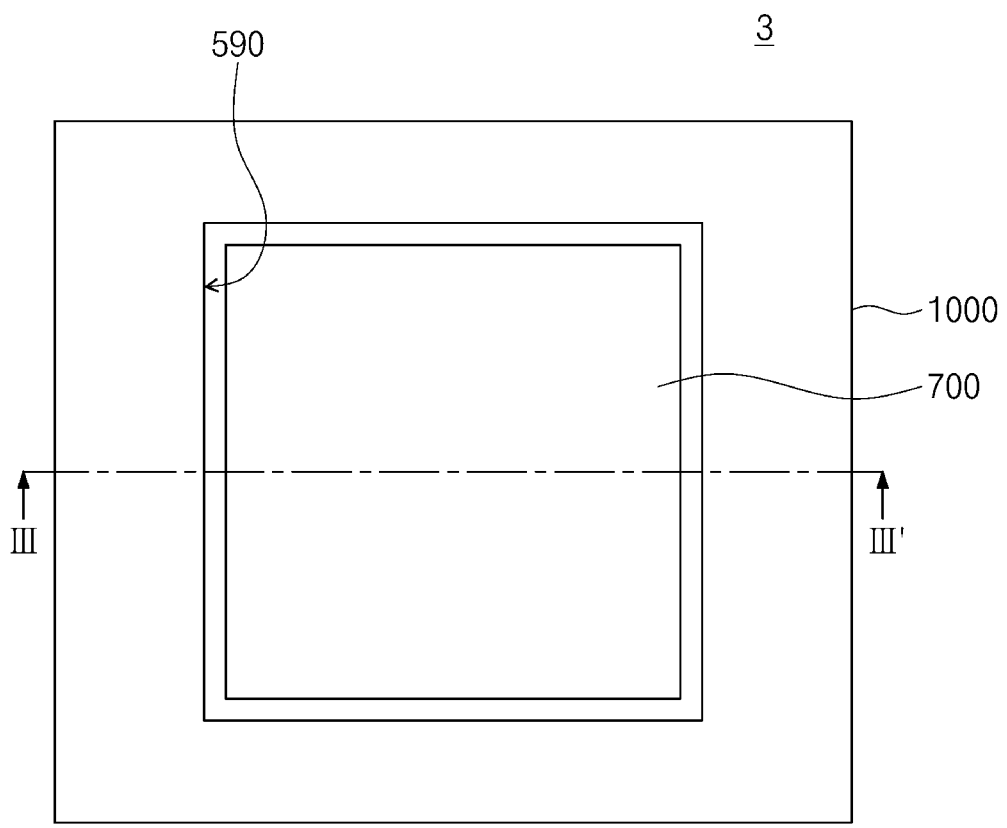
FIG. 15 illustrates a plan view showing a semiconductor package including an interconnection structure according to some example embodiments of the present disclosure.
Figure 16:
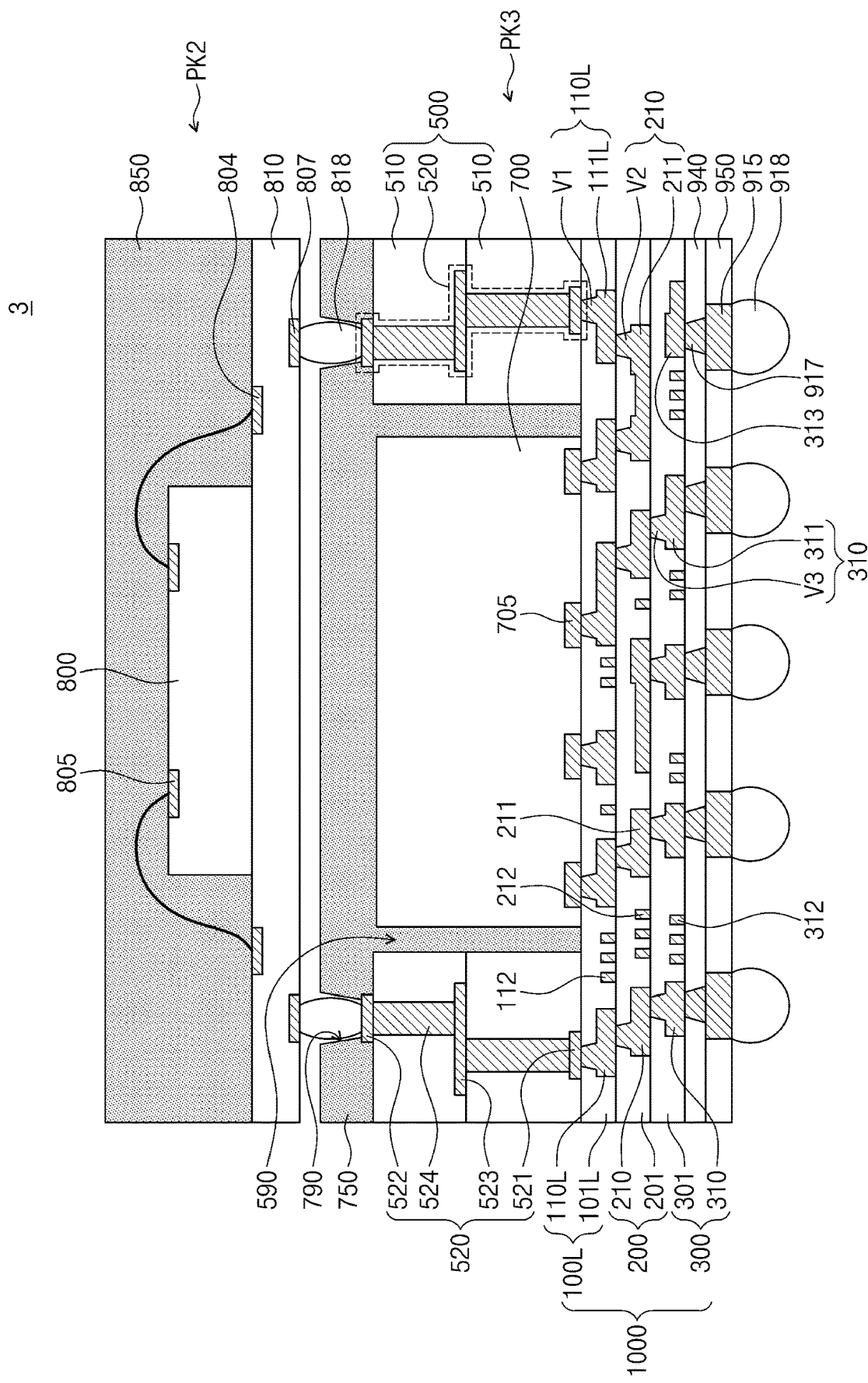
FIG. 16 illustrates a cross-sectional view taken along line of FIG. 15.

FIG. 15 illustrates a plan view showing a semiconductor package in which an interconnection structure according to embodiments of the present disclosure is applicable to a redistribution layer. FIG. 16 illustrates a cross-sectional view taken along line of FIG. 15. In FIG. 15, some components are omitted for clarity of configuration. Some repetitive descriptions given with reference to FIG. 12 will be omitted.

Referring to FIGS. 15 and 16, according to some example embodiments, a semiconductor package 3 may include a second semiconductor package PK2 stacked on a first semiconductor package PK3, which first semiconductor package PK3 may include a connection substrate 500. The connection substrate 500 may have a hole 590 that penetrates therethrough. When viewed in plan, the hole 590 may be positioned on a central portion of the redistribution substrate 1000. The first semiconductor chip 700 may be provided in the hole 590. The connection substrate 500 may be provided on the redistribution substrate 1000. For example, the connection substrate 500 may be fabricated by forming the hole 590 in a printed circuit board. The connection substrate 500 may include base layers 510 and conductive structures 520.

The base layers 510 may include a dielectric material. For example, the base layers 510 may include a carbon-based material, a ceramic, or a polymer. The hole 590 may penetrate the base layers 510. The conductive structures 520 may each include a first pad 521, a conductive line 523, and a second pad 522.

The first pad 521 may be provided on a bottom surface of the connection substrate 500. The conductive line 523 may be interposed between the base layers 510. Vias 524 may penetrate the base layers 510 and may be coupled to the conductive line 523. The second pad 522 may be disposed on a top surface of the connection substrate 500 and coupled to one of the vias 524. The second pad 522 may be electrically connected to the first pad 521 through the vias 524 and the conductive line 523.

The second pad 522 may not be vertically aligned with the first pad 521. The second pad 522 and the first pad 521 may differ from each other in number or arrangement. The conductive structures 520 may include metal. The conductive structures 520 may be provided, for example, before or after the first semiconductor chip 700 is provided. The conductive structures 520 may include, for example, at least one selected from copper, aluminum, gold, lead, stainless steels, iron, and alloys thereof.

A first molding member 750 may fill a gap between the first semiconductor chip 700 and the connection substrate 500. The first molding member 750 may have therein upper holes 790 that expose each second pad 522 of the conductive structures 520.

The redistribution substrate 1000 may be provided on one surface of the first molding member 750 and one surface of the first semiconductor chip 700.

The redistribution substrate 1000 may include the first, second, and third redistribution layers 100L, 200, and 300 as discussed with respect to FIG. 12.

The first redistribution layer 100L, the second redistribution layer 200, and the third redistribution layer 300 may be sequentially stacked on the one surface of the first semiconductor chip 700.

One or more of the first via parts V1 of the first redistribution patterns 110L may be in contact with first chip pads 705, and others of the first via parts V1 of the first redistribution patterns 110L may be in contact with corresponds ones of the first pad 521 of the conductive structures 730.

A first passivation layer 940 and a second passivation layer 950 may be provided on the third redistribution layer 300. The first passivation layer 940 may have vias 917 therein, and the second passivation layer 950 may have terminal pads 915 therein. The vias 917 may be in contact with the terminal pads 915 and a plurality of the third connection pad part 313 of the third redistribution patterns 310. The terminal pads 915 may be provided with external coupling terminals 918 thereon. One or more of the external coupling terminals 918 may be coupled through the first, second, and third redistribution patterns 110L, 210, and 310 to the first semiconductor chip 700, and others of the external coupling terminals 918 may be electrically connected through the first, second, and third redistribution patterns 110L, 210, and 310 to the conductive structures 520.

In comparison with FIGS. 12 and 13, the first redistribution patterns 110L of the redistribution substrate 1000 may be in direct contact with the first chip pads 705 without intermediate members such as connection terminals (e.g., solders or bumps).

The second semiconductor package PK2 may be substantially the same as the second semiconductor package PK2 discussed in FIG. 13. Package coupling terminals 818 may be provided in the upper holes 790 of the first molding member 750. The package coupling terminals 818 may be interposed between and electrically connected to the plurality of the second pad 522 and the metal pads 807. Therefore, the second semiconductor package PK2 may be electrically connected through the package coupling terminals 818 to the first semiconductor chip 700 and the external coupling terminals 918. An electrical connection with the second semiconductor package PK2 may include an electrical connection with integrated circuits in the second semiconductor chip 800.

According to embodiments of the present disclosure, it may be possible to fabricate an interconnection structure with improved reliability and a semiconductor package including the same.

The aforementioned description provides some example embodiments for explaining the present disclosure. Therefore, the present disclosure is not limited to the embodiments described above, and it will be understood by one of ordinary skill in the art that variations in form and detail may be made therein without departing from the spirit of embodiments of the present disclosure.

What is claimed is:

1. A method for manufacturing a semiconductor package, comprising:
    forming a photoimageable dielectric layer on a substrate including a pad;
    forming a preliminary via hole in the photoimageable dielectric layer to expose the pad;
    forming a hard mask layer on the photoimageable dielectric layer and the pad;
    etching the photoimageable dielectric layer and the hard mask layer to form a via hole, a first hole, and a trench;
    forming a metal layer on the photoimageable dielectric layer connected to the pad;
    planarizing the metal layer to form a wiring pattern; and
    placing a semiconductor chip electrically connected to the wiring pattern,
    wherein the first hole is disposed on the via hole and connected thereto,
    wherein a diameter of the first hole is larger than a diameter of the via hole, and
    wherein the etching the photoimageable dielectric layer and the hard mask layer comprises:
        placing a mask pattern including a first opening vertically overlapping the preliminary via hole and a second opening spaced apart from the first opening on the hard mask layer.

2. The method of manufacturing the semiconductor package according to claim 1, wherein a diameter of the first opening is larger than a size of the preliminary via hole.

3. The method of manufacturing the semiconductor package according to claim 1, wherein the photoimageable dielectric layer includes a photosensitive polymer.

4. The method of manufacturing the semiconductor package according to claim 1, wherein the forming the preliminary via hole comprises performing sequential exposure, development, and curing processes on the photoimageable dielectric layer.

5. The method of manufacturing the semiconductor package according to claim 1, wherein the hard mask layer includes a metal material having an etch selectivity with respect to the photoimageable dielectric layer.

6. The method of manufacturing the semiconductor package according to claim 1, wherein the hard mask layer includes titanium or tantalum.

7. The method of manufacturing the semiconductor package according to claim 1, wherein the diameter of the first hole is at least 7 times larger than a width of the trench.

8. The method of manufacturing the semiconductor package according to claim 1, wherein a width of the trench is greater than 0 micrometers and less than or equal to 3 micrometers.

9. The method of manufacturing the semiconductor package according to claim 1, wherein the etching the photoimageable dielectric layer and the hard mask layer comprises a dry etching process.

10. The method of manufacturing the semiconductor package according to claim 1, wherein the forming the metal layer comprises:
    forming a barrier layer; and
    forming a conductive layer on the barrier layer, and
    wherein the forming the conductive layer comprises an electroplating process.

11. The method of manufacturing the semiconductor package according to claim 10, wherein the barrier layer covers inner walls of the via hole, the first hole, and the trench.

12. The method of manufacturing the semiconductor package according to claim 1, wherein a level of a bottom surface of the first hole is lower than a level of a bottom surface of the trench.

13. The method of manufacturing the semiconductor package according to claim 1, wherein a level of a bottom surface of the first hole is lower than a level of a bottom surface of the trench by 0.3 to 0.8 micrometers.

14. A method for manufacturing a semiconductor package, comprising:
   forming a dielectric layer on a substrate including a pad;
   forming a preliminary via hole in the dielectric layer to expose the pad;
   forming, after the forming the preliminary via hole, a hard mask layer on the dielectric layer;
   forming a first hole, a via hole, and a trench after the forming the hard mask layer, wherein the via hole is connected to the first hole, and the trench is spaced apart from the first hole and the via hole, and the forming the first hole, the via hole, and the trench comprises etching the dielectric layer and the hard mask layer using a dry etching process, the etching comprising expanding the preliminary via hole to form the first hole and the via hole;
   forming a metal layer filling the first hole, the via hole, and the trench;
   planarizing the metal layer to form a wiring pattern; and
   electrically connecting the wiring pattern to a semiconductor chip.

15. The method of manufacturing the semiconductor package according to claim 14, wherein the wiring pattern includes a via body filling the via hole and integrally connected thereto, a via pad body filling the first hole and vertically overlapping the via body, and a line body extending from the via pad body.

16. The method of manufacturing the semiconductor package according to claim 1, wherein, based on a level of a top surface of the pad, a level of a bottom surface of the first hole is higher than a level of a bottom surface of the trench.

17. The method of manufacturing the semiconductor package according to claim 14, wherein the dielectric layer includes a photosensitive polymer, and the forming the preliminary via hole comprising performing sequential exposure, development, and curing processes on the dielectric layer.

18. The method of manufacturing the semiconductor package according to claim 1, wherein the hard mask layer includes titanium or tantalum.

19. The method of manufacturing the semiconductor package according to claim 1, wherein the diameter of the first hole is at least 7 times larger than a width of the trench, and the width of the trench is greater than 0 micrometers and less than or equal to 3 micrometers.

20. The method of manufacturing the semiconductor package according to claim 14, wherein the etching the dielectric layer and the hard mask layer further comprises:
   forming a mask pattern on the hard mask layer including a first opening and a second opening,
   wherein the first opening has a diameter larger than the preliminary via hole and vertically overlaps the preliminary via hole, and
   wherein a position of the second opening corresponds to a location where the trench is formed.

\* \* \* \* \*